(12) United States Patent
Yang et al.

(10) Patent No.: US 11,797,049 B2
(45) Date of Patent: Oct. 24, 2023

(54) DISPLAY DEVICE

(71) Applicant: Wuhan Tianma Microelectronics Co., Ltd., Wuhan (CN)

(72) Inventors: Jun Yang, Wuhan (CN); Shuxiong Song, Wuhan (CN); Shengming Li, Wuhan (CN); Qin Xu, Wuhan (CN); Jiang Chen, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 23 days.

(21) Appl. No.: 17/545,071

(22) Filed: Dec. 8, 2021

(65) Prior Publication Data

US 2022/0104364 A1 Mar. 31, 2022

(30) Foreign Application Priority Data

Sep. 29, 2021 (CN) .......................... 202111152656.1

(51) Int. Cl.
*G06F 1/16* (2006.01)
*H05K 5/02* (2006.01)

(52) U.S. Cl.
CPC ......... *G06F 1/1624* (2013.01); *H05K 5/0217* (2013.01)

(58) Field of Classification Search
CPC .... G06F 1/1624; G06F 1/1652; G06F 1/1637; H05K 5/0017; H05K 5/0217
See application file for complete search history.

(56) References Cited

U.S. PATENT DOCUMENTS

| | | | |
|---|---|---|---|
| 10,827,631 B2 * | 11/2020 | Liu | G09F 9/301 |
| 11,287,854 B2 * | 3/2022 | Morino | G06F 1/1652 |
| 11,366,496 B2 * | 6/2022 | Feng | G06F 1/1681 |
| 2011/0249384 A1 * | 10/2011 | Warren | G06F 1/1624 |
| | | | 361/679.01 |
| 2020/0166974 A1 * | 5/2020 | Ai | H04M 1/0216 |
| 2021/0026417 A1 * | 1/2021 | Morino | G06F 1/1681 |
| 2021/0116971 A1 * | 4/2021 | Feng | G06F 1/1652 |
| 2021/0365069 A1 * | 11/2021 | Wen | G06F 1/1688 |

FOREIGN PATENT DOCUMENTS

| | | |
|---|---|---|
| CN | 110992837 A | 4/2020 |
| CN | 112233557 A | 1/2021 |
| CN | 112530286 A | 3/2021 |

* cited by examiner

*Primary Examiner* — Sagar Shrestha
(74) *Attorney, Agent, or Firm* — KDW Firm PLLC

(57) ABSTRACT

Provided is a display device. The display device includes a display panel and a plurality of support structures located on one side of the display panel facing away from the light-emitting side. The plurality of support structures support different regions of the display panel and are configured to adjust vertical heights of the different regions of the display panel.

19 Claims, 9 Drawing Sheets

DISPLAY DEVICE

CROSS-REFERENCE TO RELATED APPLICATIONS

This application claims priority to Chinese patent application No. 202111152656.1 filed with CNIPA on Sep. 29, 2021, the disclosure of which is incorporated herein by reference in its entirety.

TECHNICAL FIELD

Embodiments of the present disclosure relate to the field of display technology and, in particular, to a display device.

BACKGROUND

Nowadays, flexible display panels have gradually come into sight of consumers, and the rollability of screens has greatly expanded the application of flexible display panels in the display field. Flexible display screens have outstanding advantages over traditional screens: lighter and thinner in volume and lower in power consumption, thereby helping to improve the standby capability of devices.

SUMMARY

The present disclosure provides a display device to ensure the flatness of a display screen during a stretching process and avoid the wrinkle issue caused by an uneven force.

Embodiments of the present disclosure provide a display device. The display device includes a display panel and multiple support structures located on one side of the display panel facing away from the light-emitting side. The multiple support structures support different regions of the display panel and are configured to adjust vertical heights of the different regions of the display panel.

DETAILED DESCRIPTION

Figure 1:
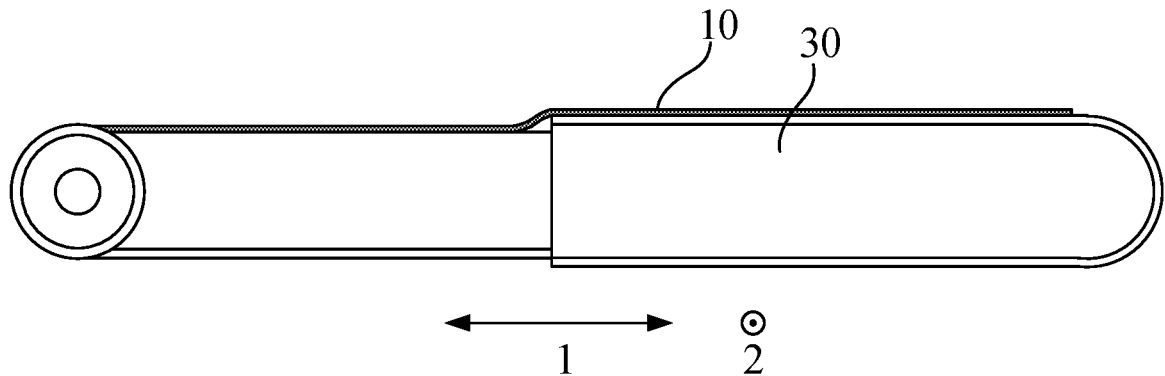
FIG. 1 is a view illustrating the structure of an existing stretchable display device.

The present disclosure is further described hereinafter in detail in conjunction with drawings and embodiments. It is to be understood that the embodiments described herein are intended to illustrate and not to limit the present disclosure. Additionally, it is to be noted that for ease of description, only part, not all, of the structures related to the present disclosure are illustrated in the drawings.

FIG. 1 is a view illustrating the structure of an existing stretchable display device. Referring to FIG. 1, when the stretchable display device is stretched in the first direction 1, the pulling force exerted at different positions of the flexible display panel 10 is easily uneven in the second direction 2 (the second direction 2 is parallel to the display panel 10 and vertical to the first direction 1), and it is conceivable that the local displacement amount of the display panel 10 in a stretching process is inconsistent, easily wrinkling the local regions, especially the edge positions of the display panel 10. Moreover, as shown in FIG. 1, the two embedded housing structures 30 carrying the flexible display panel 10 in the stretchable display device have a certain surface step, so the flexible display panel 10 is not flat at the step, and the friction force of the display panel 10 at different positions in the first direction 1 are also uneven, causing the display panel 10 to slide unsmoothly and easily wrinkle. The long-term wrinkle of the display panel 10 affects such structures as circuit structures and optical structures at the wrinkled position, resulting in damage and greatly reducing the service life of the panel.

Embodiments of the present disclosure provide a display device. The display device includes a display panel and multiple support structures located on one side of the display panel facing away from the light-emitting side. The multiple support structures support different regions of the display panel and are configured to adjust the vertical heights of the different regions of the display panel.

In the embodiments of the present disclosure, with the configuration in which the multiple support structures are disposed to support the different regions of the display panel and configured to adjust the vertical heights of the different regions of the display panel, the heights of the different positions of the display panel can remain consistent to control the flatness of the surface of the display panel, or the different positions of the display panel can be rolled or bent according to the set shape to control the smoothness of the surface of the display panel. That is, the display device according to the embodiments of the present disclosure may be at liberty to control the configuration of the surface of the display panel through the multiple support structures according to needs. With this configuration, that the display panel of an existing stretchable display device is easy to wrinkle due to an uneven force applied to the display panel is avoided, the form of the surface of the display panel is controlled precisely, wrinkles and internal damage caused by the uneven force are avoided, and thus the service life is prolonged. Moreover, for the stretchable display device, the step is avoided between housing components, not only improving the flatness of the screen, but also improving the smoothness during a stretching process, thereby improving the user experience.

The preceding is the core idea of the display panel of the present disclosure. Hereinafter, technical schemes in the embodiments of the present disclosure are described clearly and completely in conjunction with the drawings in the embodiments of the present disclosure. Based on the embodiments of the present disclosure, all other embodiments obtained by those having ordinary skill in the art without creative work are within the scope of the present disclosure.

Figure 2:
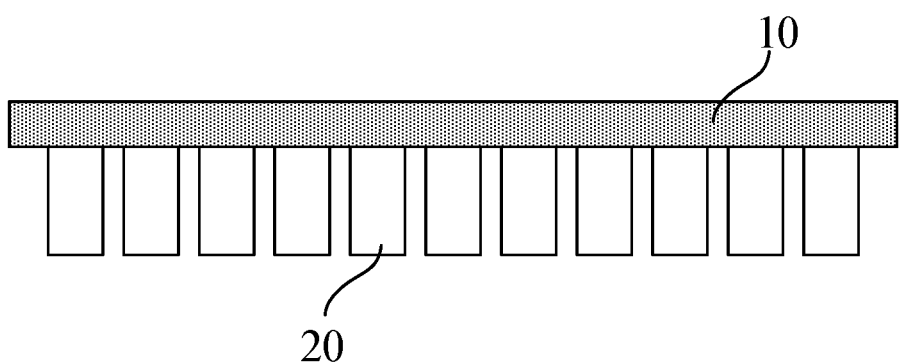
FIG. 2 is a view illustrating the structure of a display device according to embodiments of the present disclosure.

FIG. 2 is a view illustrating the structure of a display device according to embodiments of the present disclosure. Referring to FIG. 2, the display device includes a display panel 10 and multiple support structures 20 located on one side of the display panel 10 facing away from the light-emitting side, and the multiple support structures 20 support different regions of the display panel 10 and are configured to adjust the vertical heights of the different regions of the display panel 10.

The multiple support structures 20 are disposed on the side of the display panel 10 facing away from the light-emitting side and support the back of the display panel 10. The multiple support structures 20 are configured to adjust the vertical heights of the contact regions on the display panel 10. That is, the multiple support structures 20 may move up and down in the direction vertical to the plane on which the contact regions are located to adjust the heights of local regions of the display panel 10 in the vertical direction. For the entire display panel 10, the heights of multiple regions determine the entire form of the surface, so in the controlling process of the entire form of the surface, the multiple support structures 20 are configured to adjust the heights of the multiple regions correspondingly, thereby controlling the entire form of the surface of the display panel 10.

The vertical projections of the multiple support structures 20 on the plane on which the display panel 10 is located are evenly arranged, that is, the multiple support structures 20 are evenly arranged at the back of the display panel 10 to evenly support the display panel 10. In an embodiment, the multiple support structures 20 may be arranged in a matrix having multiple rows and multiple columns, arranged in one row and multiple columns, or arranged in one column and multiple rows. It is to be understood that the arrangement mode and arrangement quantity or density of the multiple support structures 20 and the shape, size or the others of the contact structures between the multiple support structures 20 and the display panel depend on the shape of the display panel and the regulation precision required by the form of the surface of the display panel, which may be designed by those skilled in the art according to actual needs and are not limited here.

The form of the surface of the display panel of the display device as shown in FIG. 2 needs to be flat, so when the surface of the display panel 10 is regulated through the multiple support structures 20, the vertical height of each region needs to be accurately controlled to keep consistent. Certainly, the embodiments of the present disclosure are not limited to the display device having a flat surface. For example, the display panel may have such forms of the surface as an arced surface, and the embodiments of the present disclosure may also be implemented by adjusting the vertical heights of local regions of the display panel 10 through the multiple support structures 20. Additionally, the embodiments of the present disclosure may be applicable to hard display devices or disposed in flexible display devices, for example, the preceding stretchable display device and the others. The stretchable display device is illustrated in detail in the embodiments of the present disclosure.

Figure 3:
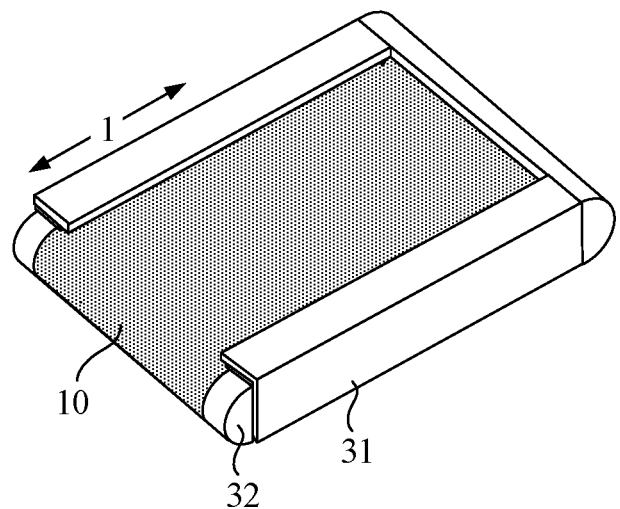
FIGS. 3 and 4 are views illustrating the three-dimensional structures of another display device in two states according to embodiments of the present disclosure.
Figure 4:
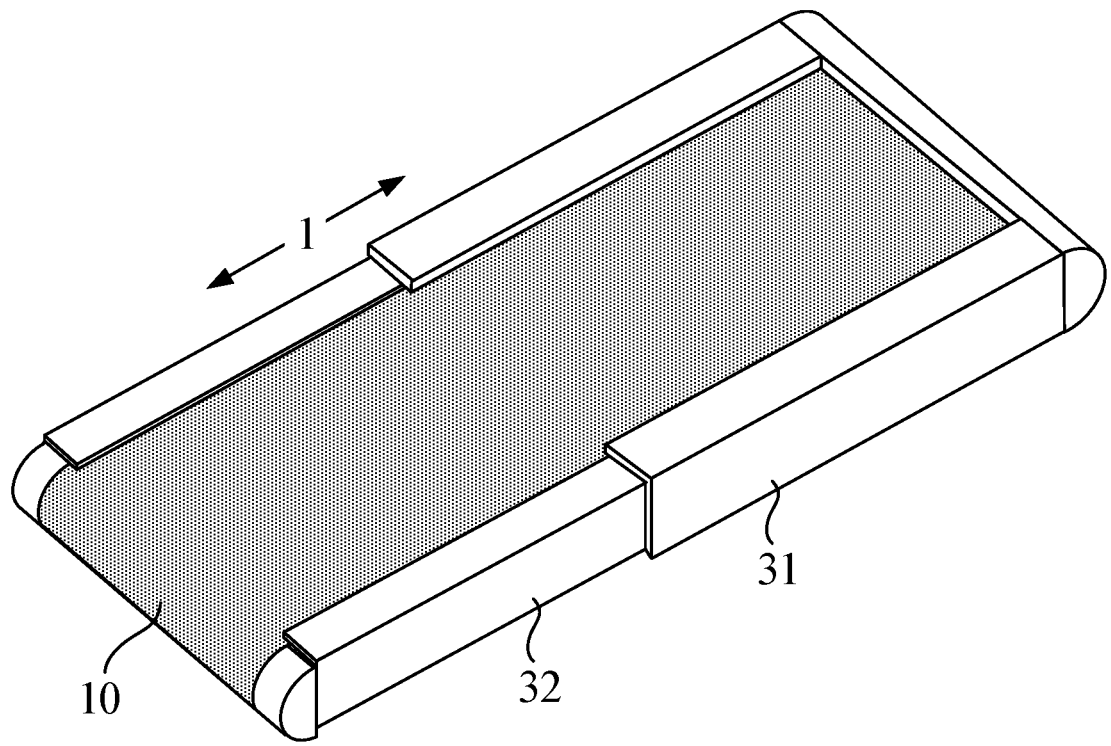

FIGS. 3 and 4 are views illustrating the three-dimensional structures of another display device in two states according to embodiments of the present disclosure. Referring to FIGS. 2 to 4, based on the structure of the display device in FIG. 2, the display device of the embodiments of the present disclosure further includes a first housing 31 and a second housing 32 embedded to each other; the multiple support structures (not shown) are sequentially arranged in the first direction 1 and located in an accommodating cavity formed by the first housing 31 and the second housing 32, the first housing 31 and the second housing 32 may be relatively movable in the first direction 1, and the multiple support structures may be relatively retractable in the first direction 1; where the first direction 1 is parallel to the plane on which the display panel 10 is located.

It is to be understood that the stretching process of the stretchable display device in the embodiments of the present disclosure is actually a process in which the first housing 31 and the second housing 32 are movable in a direction away from or towards each other, or a process in which the second housing 32 embedded into the first housing 31 is pulled out of the first housing 31. In the process, the display panel 10 protrudes corresponding areas according to different stretching degrees. In the embodiment, the first housing 31 and the second housing 32 embedded to each other play the main role in accommodating the non-protruding part of the display panel 10 by forming the accommodating cavity. Different from the existing stretchable display panel, for the protruding part of the display panel 10, the multiple support structures 20 inside the first housing 31 and the second housing 32 play the main supporting role instead of the first housing 31 and the second housing 32. The surface of one side of the first housing 31 and the second housing 32 facing the display panel 10 is hollow to ensure the direct contact between the multiple support structures and the display panel 10.

Figure 5:
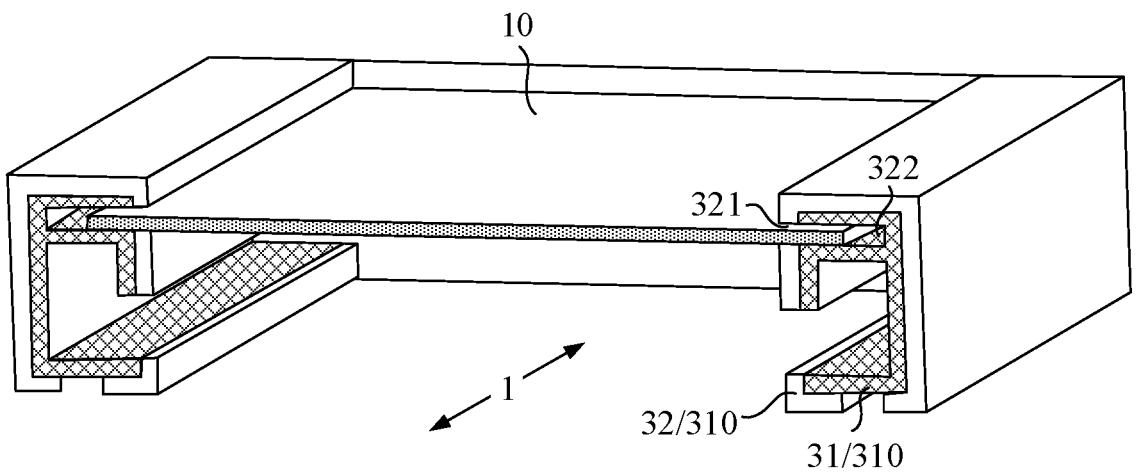
FIG. 5 is a sectional perspective view of housings and a display panel in the display device of FIG. 3.
Figure 6:
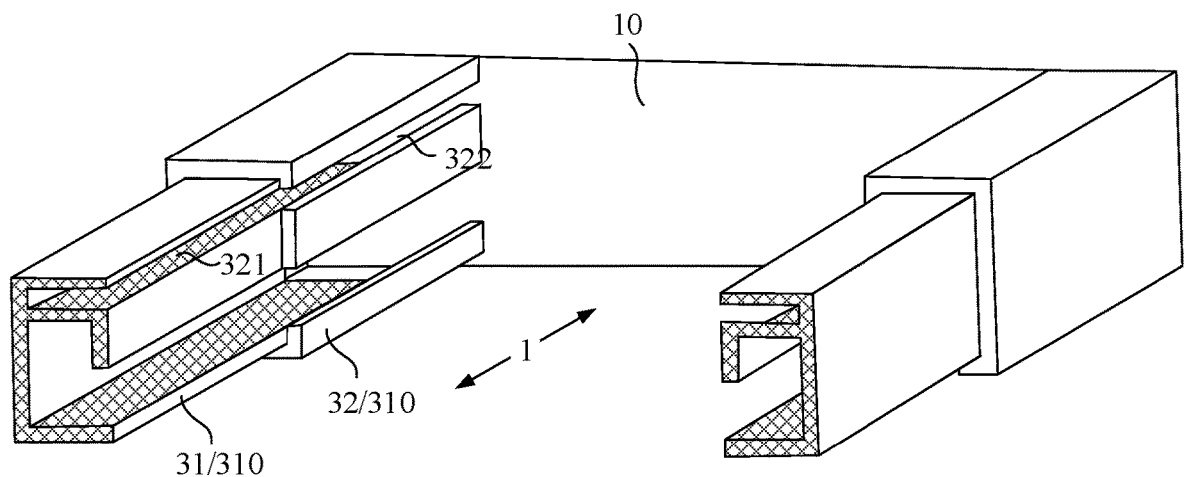
FIG. 6 is a sectional perspective view of housings of the display device of FIG. 4.

FIG. 5 is a sectional perspective view of housings and a display panel in the display device of FIG. 3, and FIG. 6 is a sectional perspective view of housings of the display device in FIG. 4. Referring to FIGS. 3 to 6, further, guideway structures 310 matchable with each other are disposed on the first housing 31 and the second housing 32 respectively, and the first housing 31 and the second housing 32 are slidably connected to each other through the guideway structures 310.

The guideway structures 310 matchable with each other on the first housing 31 and the second housing 32 are actually tracks disposed on the first housing 31 and the second housing 32 respectively. The second housing 32 is embedded into the track on the first housing 31 and slidable in the track. Based on the guideway structures 310, the first housing 31 and the second housing 32 may be movable in the first direction 1 in directions towards or away from each other to make the housing structures retractable.

With continued reference to FIGS. 3 to 6, further, the inner wall of the first housing 31 is provided with a first panel slidable groove 321, a second panel slidable groove 322 is disposed on the inner wall of the second housing 32, the height of the first panel slidable groove 321 is flush with the height of the second panel slidable groove 322 in the direction vertical to the display panel 10, and two sides of the display panel 10 vertical to the first direction 1 are accommodated in the first panel slidable groove 321 and the second panel slidable groove 322. In this case, the multiple support structures in the accommodating cavity are mainly responsible for supporting the display panel 10, and the two housings play the secondary role in supporting the display panel 10, that is, when the first panel slidable groove 321 and the second panel slidable groove 322 accommodate the two side edges of the display panel 10, the two panel slidable grooves 321 and 322 are further responsible for supporting the two sides of the display panel 10. Additionally, the two panel slidable grooves 321 and 322 are configured to limit the vertical height and the horizontal position of the display panel 10, thereby avoiding the deviation of the display panel 10.

Figure 7:
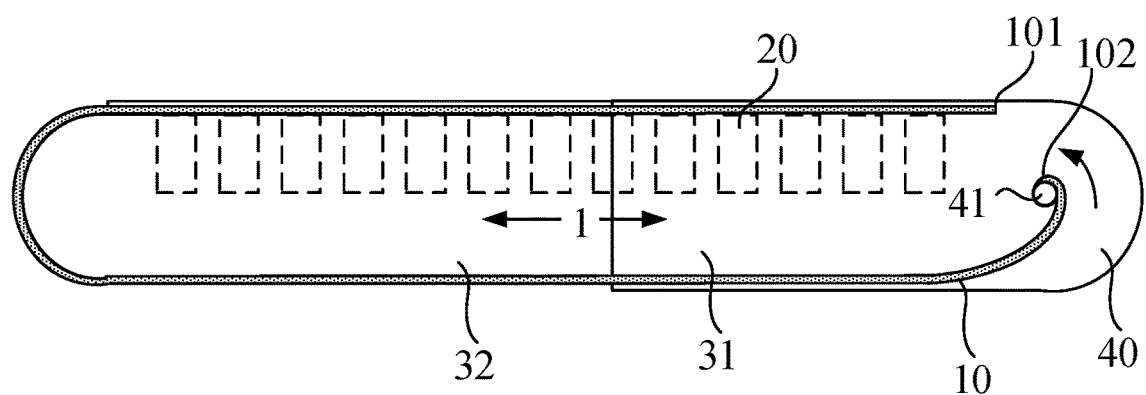
FIG. 7 is a section view of the display device of FIG. 4.

FIG. 7 is a section view of the display device of FIG. 4. Referring to FIGS. 4 and 7, one end of the first housing 31 facing away from the second housing 32 is provided with a panel rolling cavity 40, a resilient reel 41 is disposed in the panel rolling cavity 40, the display panel 10 includes a first side 101 and a second side 102 opposite to each other, the first side 101 of the display panel 10 is secured to the first housing 31, the second side of the display panel 10 is secured to the resilient reel 41, and the display panel 10 is configured to roll around the resilient reel 41.

The panel rolling cavity 40 is configured to accommodate the rolled part of the display panel 10, and the resilient reel 41 may be construed as a winding mechanism having a rolling ability. The second side 102 of the display panel 10 is secured to the resilient reel 41, and the resilient reel 41 is configured to supply a rolling force for the display panel 10, causing the display panel 10 to roll on the resilient reel 41 without an external force. Moreover, since the display panel 10 is bent around the second housing 32, the first side 101 is also secured to the first housing 31, the part of the display panel 10 rolled on the resilient reel 41 is pulled out when the second housing 32 is pulled out of the first housing 31. In the process, the display panel 10 is slidable relative to the outer surface of the second housing 32, and the area of the display panel 10 located on the front of the first housing 31 and the second housing 32 gradually increases. It is to be noted that the relative movement of the first housing 31 and the second housing 32 may be implemented by a human external force, or an automatic driving structure may be disposed in the first housing 31 and the second housing 32, and the relative movement is implemented by the display device itself. This is not limited here.

The preceding is the foundation of the housing structures of the stretchable display device according to the embodiments of the present disclosure. Appropriate transformations made by those skilled in the art based on this fall within the protection scope of the embodiment of the present disclosure. Additionally, those skilled in the art may design the details of the housing structures that are not described in the embodiment according to actual situations. The multiple support structures in the stretchable display device are described in detail below based on the preceding foundation of the housing structures.

Figure 8:
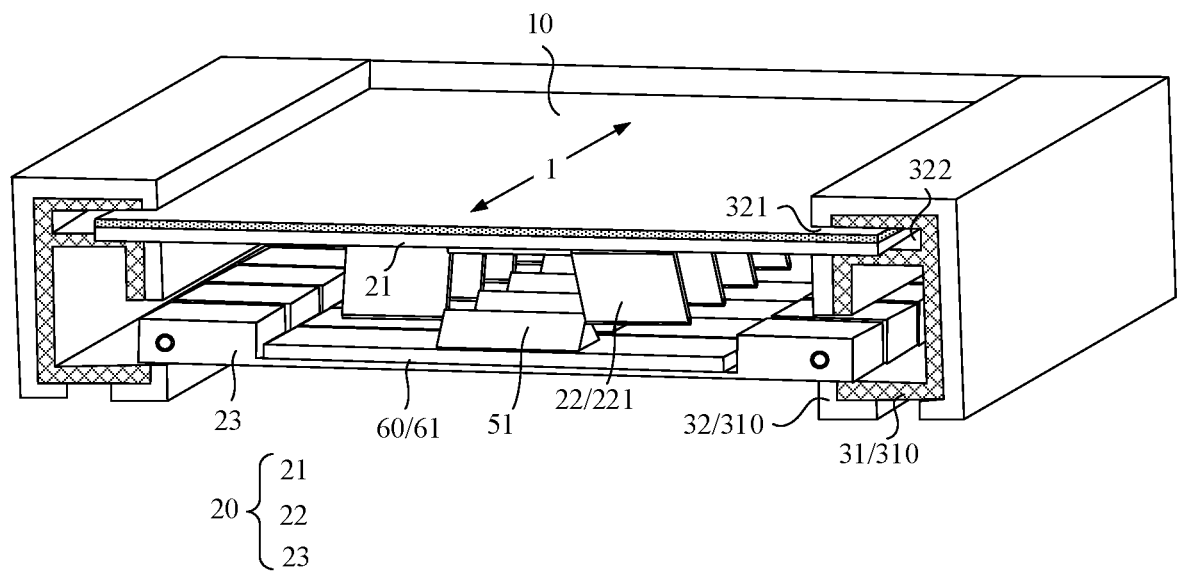
FIG. 8 is a sectional perspective view of the display device of FIG. 3 or FIG. 4.
Figure 9:
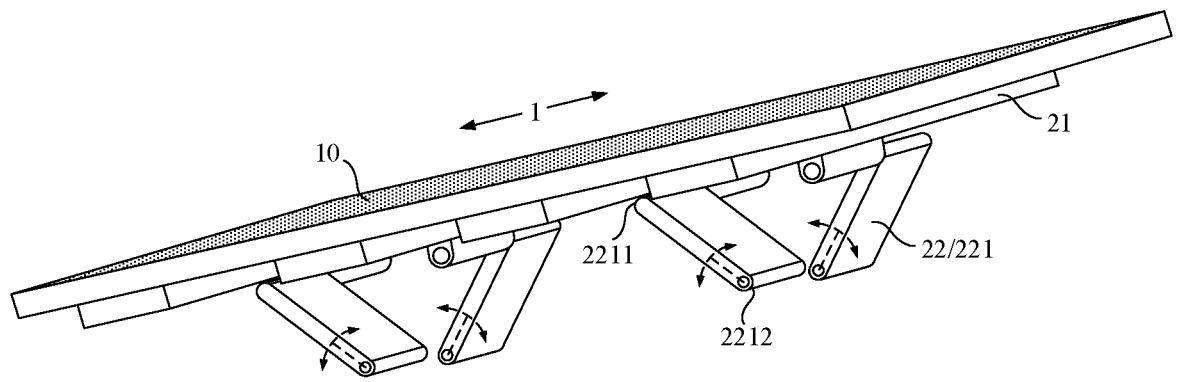
FIG. 9 is a three-dimensional view of support structures of the display device of FIG. 3 or FIG. 4.

FIG. 8 is a sectional perspective view of the display device in FIG. 3 or FIG. 4, and FIG. 9 is a three-dimensional view of support structures of the display device in FIG. 3 or FIG. 4. Referring to FIGS. 8 and 9, in the display device, the multiple support structures 20 include multiple support plates 21, the multiple support plates 21 abut against different regions on the side of the display panel 10 facing away from the light-emitting side, and the vertical projections of the multiple support plates 21 on the plane on which the display panel 10 is located do not overlap.

The support plate 21 is a strip plate having a length slightly less than the width of the display panel 10 vertical to the first direction 1. Each support plate 21 is responsible for supporting a strip-shaped region of the display panel 10 at a certain position in the first direction 1. It is to be understood that the multiple support plates 21 may regulate the vertical heights of the entire display panel 10 at different positions in the first direction 1, thereby ensuring the flatness of the display panel 10.

It is to be noted that in a stretching process, the display panel 10 protrudes out of the preceding panel rolling cavity 40, so the area of the front of the display panel 10 increases, and meanwhile, the relative movement also occurs among the multiple support plates 21. It is to be understood that when the area of the front of the display panel 10 increases after the display panel 10 is stretched, if the fixed number of support plates 21 need to evenly support the display panel 10 having an increased area, the distance between the support plates 21 needs to be increased. That is, the support plates 21 are slidable relative to the display panel 10 located on the front, and the support plates 21 are only in a supporting relationship with the display panel 10 located on the front and do not have a fixation connection with the display panel 10.

Figure 10:
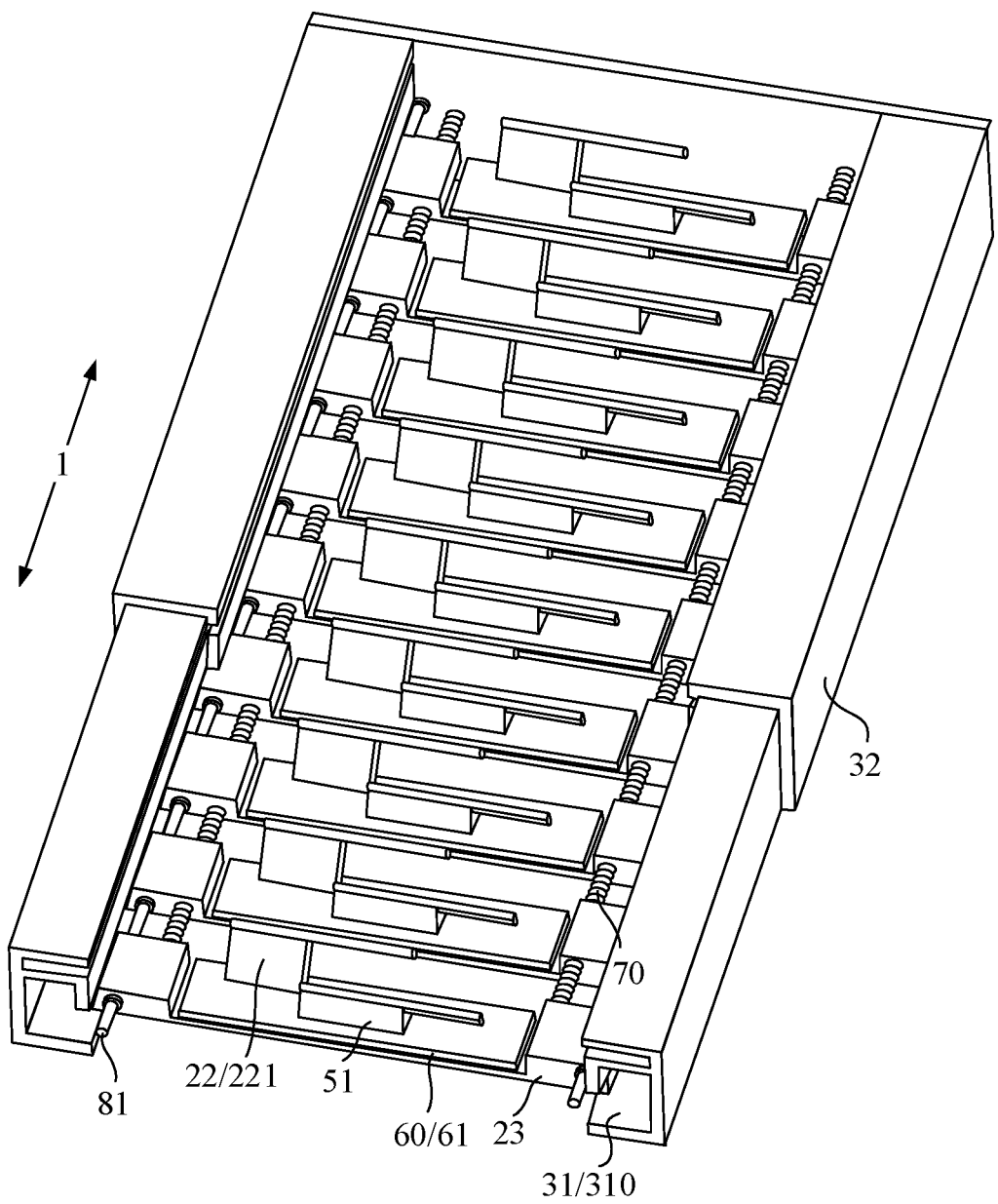
FIG. 10 is an internal view of the display device of FIG. 3 or FIG. 4.

FIG. 10 is an internal view of the display device in FIG. 3 or FIG. 4. Referring to FIGS. 8 to 10, based on this, in the embodiment, multiple resilient structures 70 are further disposed in the display device, the multiple resilient structures 70 are sequentially disposed between two adjacent ones of the multiple support structures 20, and two ends of each resilient structure 70 are secured to the respective two adjacent ones of the multiple support structures 20, respectively.

Each resilient structure 70 is responsible for supplying a resilient force to two respective ones of the multiple support structures 20 at the two ends of the resilient structure 70 and drives the spacing between the two respective ones of the multiple support structures 20 in the first direction 1 to increase or decrease. When the display device is in the fully contracted state, the multiple support structures 20 are also in the contracted state, so the distance between the multiple support structures 20 is the smallest; when the display device is in the fully stretched state, the multiple support structures 20 are also in the stretched state, so the distance between the multiple support structures 20 is the largest. An example is described below in which the first and last support structures in the first direction 1 are secured to the first housing 31 and the second housing 32 respectively. In the entire process of the display device contracting from the contracted state, the first housing 31 and the second housing 32 are movable along the first direction 1 in directions away from each other, thereby pulling the first and last support structures 20. In the process, the multiple resilient structures 70 are responsible for spreading the pulling force received at the fore and aft support structures to the multiple support structures 20 so that the multiple support structures 20 can stretch evenly. In the entire process of the display device contracting from the fully stretched state, the first housing 31 and the second housing 32 are movable along the first direction 1 in directions towards each other, thereby extruding the first and last support structures 20. In this process, the multiple resilient structures 70 are responsible for spreading the extruding force received at the fore and aft support structures to the multiple support structures 20 so that the multiple support structures 20 can contract evenly. Therefore, in the stretching or contracting process, the multiple support structures 20 can always remain evenly distributed and evenly support the display panel 10, thereby ensuring the real-time flatness of the display panel 10.

Additionally, it is to be noted that the multiple support plates only represent the part of the multiple support structures contacting with the display panel. For the vertical height of the display panel adjusted by the multiple support structures, height adjustment mechanisms may be disposed in the multiple support structures. The height adjustment mechanisms are mechanically connected to the multiple support plates to adjust the vertical heights of the multiple support plates. The height adjustment mechanisms may be implemented according to different methods, and two kinds of height adjustment mechanisms are described below.

First, with continued reference to FIGS. 8 to 10, in an embodiment of the present disclosure, the multiple support structures 20 further include height adjustment mechanisms 22, each height adjustment mechanism 22 is mechanically connected to a respective one of the multiple support plates 21 to adjust the vertical height of the respective one of the multiple support plate 21. The height adjustment mechanisms 22 include multiple inclined plates 221, the multiple inclined plates 221 are inclined relative to the display panel 10 and sequentially arranged in the first direction 1. Referring to FIG. 9, the first side 2211 of each of the multiple of inclined plate 221 is rotatably connected to a respective one of the multiple support plates 21, second sides 2212 of the multiple inclined plates 221 are located on the same plane, the first side 2211 of each of the multiple inclined plates 221 is opposite to the second side 2212 of the each of the multiple inclined plates 221; each of the multiple height adjustment mechanisms 22 is configured to adjust the vertical height of the respective one of the multiple support plates 21 in response to the inclined degree of a respective one of the multiple inclined plates 221.

As shown in FIG. 9, that the multiple inclined plates 221 are inclined relative to the display panel 10 means that the multiple inclined plates 21 are inclined relative to the front part of the display panel 10 and that the part of the display panel 10 bent to the back of the housings and the part of the display panel 10 accommodated in the panel rolling cavity are not taken into account. When the multiple inclined plates 221 have different inclined degrees, the multiple inclined plates 221 have different vertical heights so that the vertical height of the display panel 10 on the multiple support plates 21 may be adjusted by adjusting the inclined angles of the multiple inclined plates 221 through the multiple support plates 21 according to the different vertical heights of the multiple inclined plates 221. It is to be understood that based on that the length of each inclined plate 221 in the inclined direction is also the rotation radius of the inclined plate 221, the relationship between the inclined angle and the vertical height may be calculated and obtained so that the vertical heights can be adjusted by driving the multiple inclined plates 221 to rotate.

With continued reference to FIG. 9, that any two adjacent ones of the multiple inclined plates 221 are inclined relative to the display panel 10 in directions opposite to each other is an implementation of the present disclosure. It is to be understood that since the multiple inclined plates 221 exist at the back of the display panel 10 in an inclined manner, in addition to supporting the display panel 10 in the vertical direction, the multiple inclined plates 221 inevitably have certain force components in the horizontal direction. In the embodiment, two adjacent ones of the multiple inclined plates 221 are inclined in directions opposite to each other, thereby balancing the forces exerted on the display panel 10 in the horizontal direction by the multiple inclined plates 221 and avoiding the position deviation and breakage of the display panel and the like caused by the consistent horizontal action of the multiple inclined plates 221.

Figure 11:
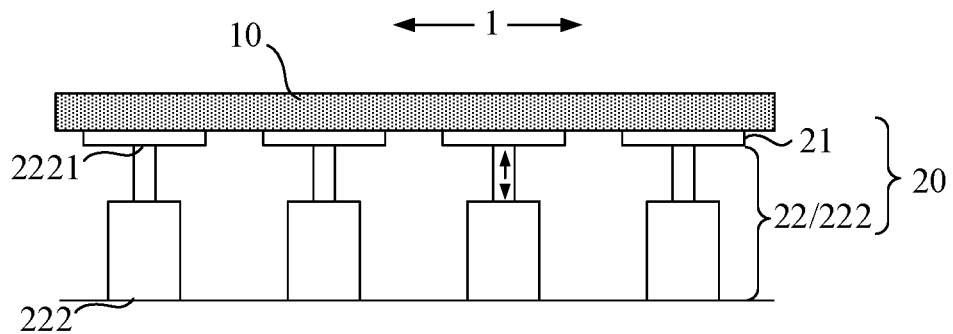
FIG. 11 is a section view of another display device according to embodiments of the present disclosure.

FIG. 11 is a section view of another display device according to embodiments of the present disclosure. Referring to FIG. 11, in another embodiment of the present disclosure, the multiple support structures 20 of the display device also include the multiple support plates 21 and the multiple height adjustment mechanisms 22. The difference is that the multiple height adjustment mechanisms 22 include multiple lifting rods 222, the extension direction of each of the multiple lifting rods 222 is vertical to the plane on which the display panel 10 is located, the first end 2221 of each of the multiple lifting rods 222 is secured to a respective one of the multiple support plates 21, second ends 2222 of the multiple lifting rods 222 are located on the same plane; each of the height adjustment mechanism 22 is configured to adjust the vertical height of a respective one of the multiple support plates 21 in response to the retraction length of a respective one of the multiple lifting rods 222.

That the extension direction of the multiple lifting rods 222 is vertical to the plane on which the display panel 10 is located actually represents that the extension direction of the plurality of lifting rods 222 is vertical to the plane on which the front part of the display panel 10 is located while the part of the display panel 10 bent to the back of the housings and the part of the display panel 10 accommodated in the panel rolling cavity are not taken into account, either. The lifting rod 222 actually refers to a retractable rod having an adjustable length and a retractable direction vertical to the front of the display panel 10.

Based on the preceding support structures, the display device of the embodiments of the present disclosure is further provided with multiple driving structures. Each of the multiple driving structures is configured to drive a respective one of the multiple height adjustment mechanisms to adjust the vertical height of a respective one of the multiple support plates in response to the magnitude of force applied to a respective one of the multiple support structures that are supporting the display panel. Each of the multiple driving structures is transmissively connected to the respective one of the multiple height adjustment mechanisms in the multiple support structures and is mainly responsible for driving the respective one of the multiple height adjustment mechanisms to transform forms to adjust the vertical height of the display panel. Taking the preceding inclined plates as an example, each of the multiple driving structures is responsible for driving a respective one of the multiple inclined plates to change the inclined angle to implement the changes in the vertical height, thereby adjusting the vertical height of the display panel.

Further, the display device in the embodiments of the present disclosure is provided with multiple force detection structures and multiple controllers. Each of the multiple controllers is electrically connected to a respective one of the multiple force detection structures and a respective one of the multiple driving structures; each of the multiple force detection structures is configured to detect the magnitude of the force applied to the respective one of the multiple support structures that are supporting the display panel, and each of the multiple controllers is configured to control the respective one of the multiple driving structures to drive the respective one of the multiple height adjustment mechanisms to adjust the vertical height of the respective one of the multiple support plates according to the magnitude of the force applied to the respective one of the multiple support structures that are supporting the display panel.

Each of the multiple force detection structures is disposed at the force surface between the display panel and the respective one of the multiple support structures, or the corresponding force position inside the display panel or the corresponding force position inside the respective one of the multiple support structures. In the retractable process of the display panel, the flexible display panel wrinkles due to the uneven pulling force in the horizontal direction. In this case, in the wrinkled region, different support structures bear different forces applied by the display panel in the vertical direction, each of the multiple force detection structures detects the force borne by the respective one of the multiple support structures and feeds back to the respective one of the multiple controllers, and the respective one of the multiple controllers may judge whether the force applied to the respective one of the multiple support structures is too large or too small according to the theoretical pressure magnitude or average pressure magnitude so as to perform the feedback control. It is to be understood that excessive forces applied to the multiple support structures represent that the corresponding positions of the display panel are depressed downward. Accordingly, the multiple support structures are driven by the multiple controllers to support the display panel, that is, when the display panel is locally depressed downward, the support structures support upward so that the normal vertical height of the depressed portion of the display panel can be restored, thereby restoring the wrinkle to the flatness.

Figure 12:
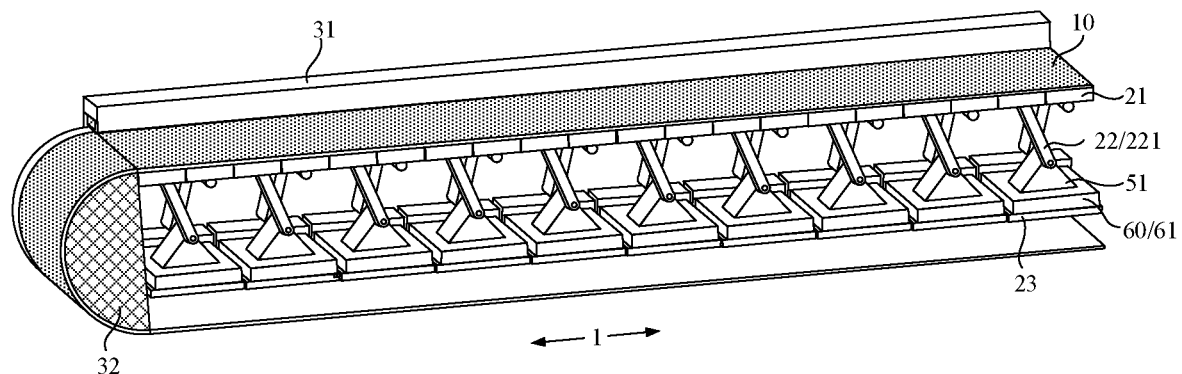
FIG. 12 is a view illustrating another internal structure of the display device of FIG. 8.
Figure 13:
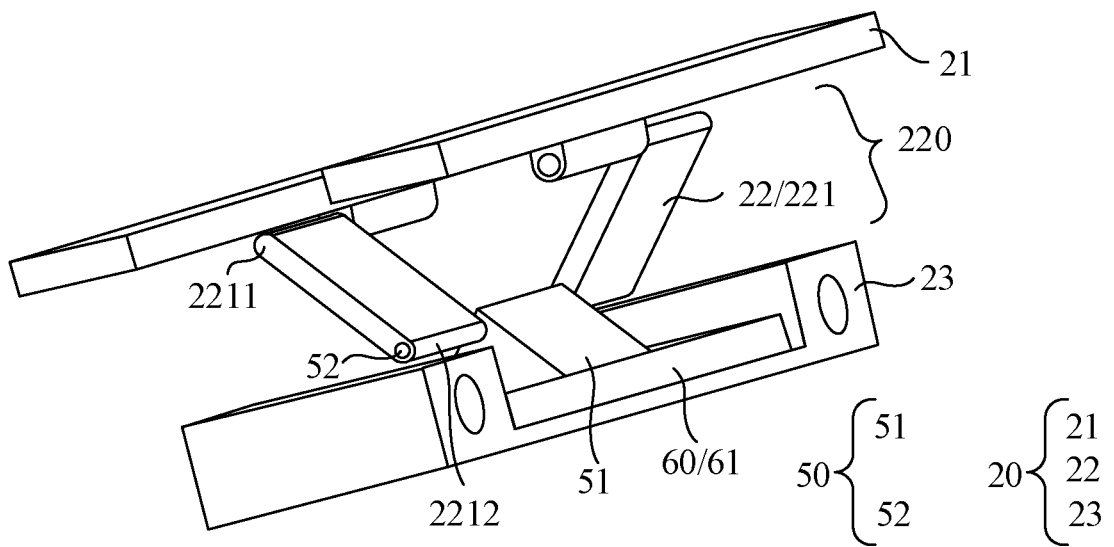
FIG. 13 is a view illustrating the structure of a support structure in the display device of FIG. 8.

FIG. 12 is a view illustrating another internal structure of the display device in FIG. 8, and FIG. 13 is a view illustrating the structure of a support structure of the display device in FIG. 8. Referring to FIGS. 12 and 13, in the display device, the multiple support structures 20 include the support plates 21 and the height adjustment mechanisms 22, the height adjustment mechanisms 22 include the multiple inclined plates 221, and any two adjacent ones of the multiple inclined plates 221 are inclined relative to the display panel 10 in directions opposite to each other. Additionally, each adjacent two ones of the multiple inclined plates 221 form one opening mechanism 220, second sides 2212 of the two adjacent ones of the one opening mechanism 220 are located on one central rotatable shaft and are rotatable towards or away from each other around the one central rotatable shaft.

The embodiment is actually a scheme in which every two inclined plates 221 are disposed to form a V-shaped opening mechanism 220 based on the preceding embodiments. The tip of the V-shaped opening mechanism 220 is the coaxial sides of the two inclined plates 221, and the process in which the two inclined plates 221 are rotatable in directions towards or away from each other is a process in which the V-shaped opening mechanism 220 closes or opens, or it is to be understood as a process in which the included angle formed by the two inclined plates 221 of the opening mechanism 220 gradually increases or decreases. In the process, the opening mechanism 220 also changes in the vertical height. Therefore, the opening angle of the V-shaped opening mechanism 220 is controlled by driving the V-shaped opening mechanism 220, so the vertical height of the region of the display panel 10 corresponding to the opening mechanism 220 may be adjusted.

As shown in FIGS. 12 and 13, the display device of the embodiment further includes multiple driving structures 50, and each of the multiple driving structures 50 is configured to drive a respective one of the multiple height adjustment mechanisms 22 to adjust the vertical height of a respective one of the multiple support plates 21 in response to the magnitude of the force applied to a respective one of the multiple support structures 20 that are supporting the display panel 10. In an embodiment, each of the multiple driving structures 50 may include a driving motor 51 and a driving rotatable shaft 52. The driving motor 51 is connected to a second side 2212 of a respective one of the multiple inclined plates 221 through the driving rotatable shaft 52 and configured to drive the respective one of the multiple inclined plates 221 to rotate by the set angle in response to the magnitude of the force applied to the respective one of the multiple support structures 20 that are supporting the display panel 10.

It is to be noted that each two inclined plates 221 in the V-shaped opening mechanism 220 of FIG. 12 are actually driven and controlled by two driving rotatable shafts 52 respectively. The two inclined plates 221 rotate with the rotation of the two driving rotatable shafts 52 respectively. When the two driving rotatable shafts 52 rotate in directions away from each other, the two inclined plates 221 are driven to rotate in directions towards or away from each other so that the opening angle of the V-shaped opening mechanism 220 becomes smaller or larger.

Additionally, to implement the automatic feedback adjustment, the display device further includes multiple force detection structures 60 and multiple controllers (not shown). Each of the multiple controllers is electrically connected to a respective one of the plurality of force detection structures 60 and a respective one of the driving structures 50; each of the multiple force detection structures 60 is configured to detect the magnitude of force applied to a respective one of the multiple support structures 20 that are supporting the display panel 10, and each of the multiple controllers is configured to control the respective one of the multiple driving structures 50 to drive the respective one of the multiple height adjustment mechanisms 22 to adjust the vertical height of the respective one of the multiple support plates 21 according to the magnitude of the force applied to the respective one of the multiple support structures 20 that are supporting the display panel 10. The multiple force detection structures 60 may include multiple stress sensors 61. The multiple support structures 20 further include multiple baseplates 23, each of the multiple height adjustment mechanisms 22 is disposed on a respective one of the multiple baseplates 23, and the multiple baseplates 23 are located on the same plane and relatively movable in the first direction 1; each of the multiple stress sensors 61, as shown in FIGS. 12 and 13, may be disposed between a second side 2212 of a respective one of the multiple inclined plates 221 and the respective one of the multiple baseplates 23, specifically between a respective one of the multiple driving motors 51 and the respective one of the multiple baseplates 23.

Alternatively, in the other embodiments of the present disclosure, each of the multiple stress sensors may also be disposed on one side of a respective one of the multiple support plates facing the display panel. In this case, the multiple stress sensors directly bear the force applied by the display panel to the support structures to measure the magnitude of the force more accurately so that the local vertical height of the display panel can be fed back and adjusted more precisely, thereby making the display panel have more precise flatness.

Figure 14:
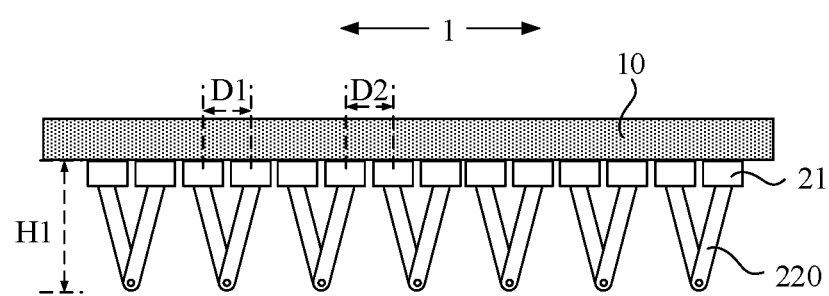
FIG. 14 and FIG. 15 illustrate the structure of a contracted display device of FIG. 8 and the structure of a stretched display device of FIG. 8 respectively.
Figure 15:
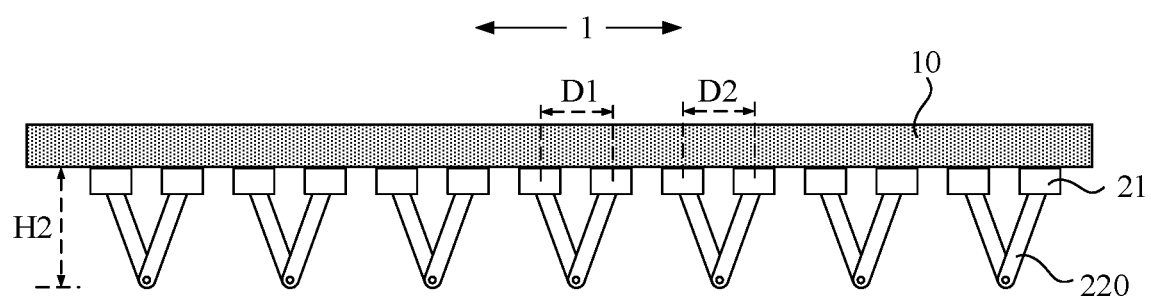

It is to be emphasized here that in the embodiment, in the process when the display device is retractable and multiple V-shaped opening mechanisms 220 are retractable relatively, to ensure that the multiple support plates 21 evenly support the display panel 10, the center-to-center spacing of two support plates 21 of one V-shaped opening mechanism 220 needs to be equal to the center-to-center spacing of two adjacent support plates 21 of two adjacent V-shaped opening mechanisms 220 in real time. FIGS. 14 and 15 illustrate the structure of a contracted display device of FIG. 8 and the structure of a stretched display device of FIG. 8 respectively. Referring to FIGS. 14 and 15, when the contracted state is converted to the stretched state, the spacing between the multiple V-shaped opening mechanisms 220 increases, that is, the center-to-center spacing D2 of two adjacent support plates 21 of two adjacent V-shaped opening mechanisms 220 increases. Meanwhile, the multiple V-shaped opening mechanisms 220 need to accordingly change from the closed state to the opening state, that is, the included angle formed by two inclined plates 221 gradually increases so as to increase the center-to-center spacing D1 of the two support plates 21 of one V-shaped opening mechanism 220 till the center-to-center spacing D1 is equal to the center-to-center spacing D2. It can be seen that in the stretching process of the display device, the opening angle of each of the multiple V-shaped opening mechanisms 220 gradually increases, and the vertical height of each of the multiple V-shaped opening mechanisms 220 is reduced from H1 to H2. Based on the preceding, the embodiment needs to lift the bottoms of the multiple V-shaped opening mechanisms 220 to ensure that the overall vertical height of the display panel 10 remains unchanged.

Figure 16:
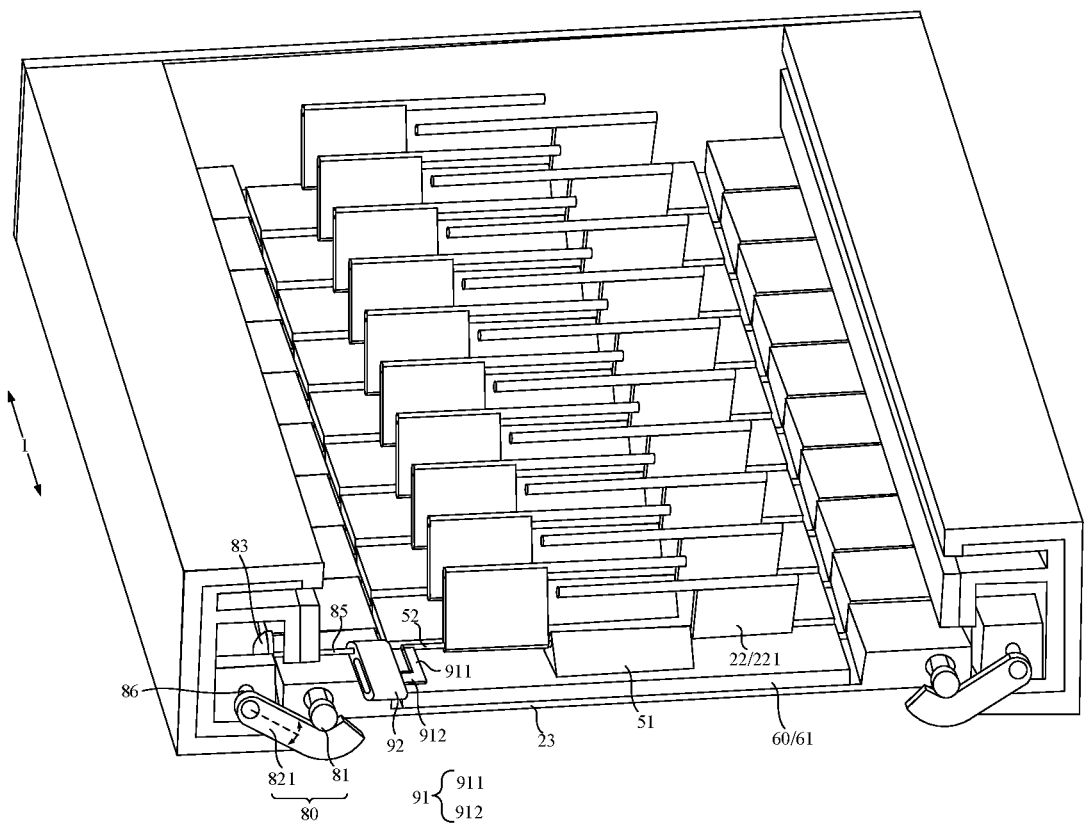
FIG. 16 is a view taken at another viewing angle to illustrate the internal structure of the display device of FIG. 8.
Figure 17:
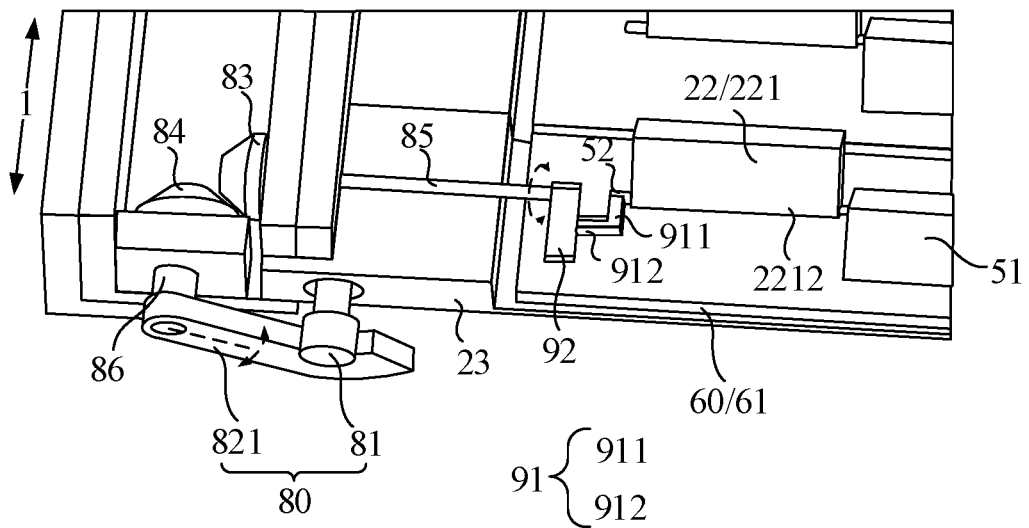
FIG. 17 is a partial enlarged view illustrating the internal structure of FIG. 16.

FIG. 16 is a view taken at another viewing angle to illustrate the internal structure of the display device of FIG. 8, and FIG. 17 is a partial enlarged view illustrating the internal structure of FIG. 16. Referring to FIGS. 16 and 17, in an embodiment, a lifting structure 80 is added in the embodiment, the lifting structure 80 is located in the accommodating cavity formed by the first housing 31 and the second housing 32, and the multiple support structures 20 are located on the lifting structure 80; the lifting structure 80 is configured to synchronously lift the height of the bottoms of the multiple support structures 20 in the accommodating cavity in response to the relative retractable amount of the first housing 31 and the second housing 32. The lifting structure 80 includes at least two retractable rods 81 and at least two support arm groups, where the number of retractable rods 81 is the same as the number of support arm groups. Each of the at least two retractable rods 81 penetrates through the multiple baseplates 23 of the plurality of support structures 20; each of the at least two support arm groups includes two support arms 821, two support arms 821 in the same support arm group synchronously support two ends of a respective one of the at least two retractable rods 81; the at least two support arm groups are configured to synchronously lift the at least two retractable rods 81 in response to the relative retractable amount of the first housing 31 and the second housing 32.

Figure 18:
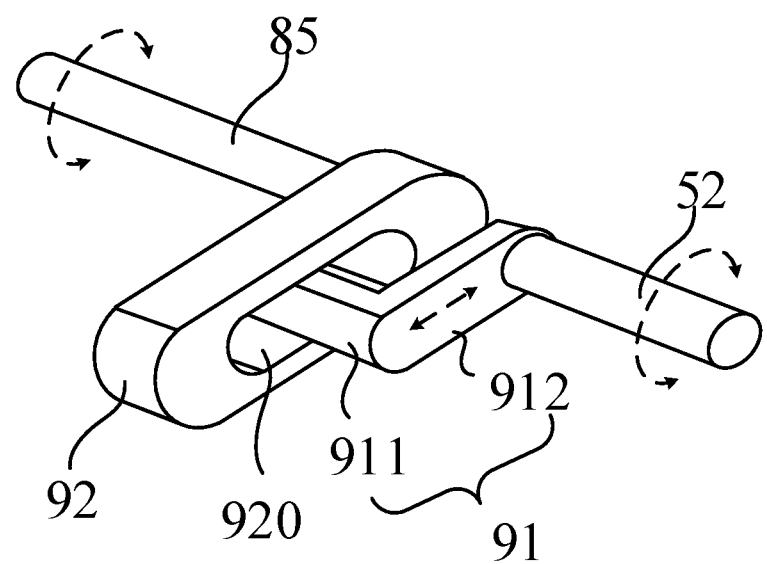
FIG. 18 is a view illustrating the structure of a transmission assembly of the lifting assembly of FIG. 16.

FIG. 18 is a view illustrating the structure of a transmission assembly of the lifting assembly of FIG. 16. Referring to FIGS. 8 and 16 to 18, further, in each of the first opening mechanism 220 and the last opening mechanism 220 in the first direction 1, second sides 2212 of inclined plates 221 are secured to a driving rotatable shaft 52, and one end of the driving rotatable shaft 52 facing away from the inclined plates 221 of the one opening mechanism is securely provided with a first transmission assembly 91. The first transmission assembly 91 includes a radial sub-rod 911 and a parallel sub-rod 912, two ends of the radial sub-rod 911 are secured to the driving rotatable shaft 52 and the parallel sub-rod 912 respectively, the radial sub-rod 911 is vertical to the driving rotatable shaft 52 and the parallel sub-rod 912, the parallel sub-rod 912 is parallel to the driving rotatable shaft 52; and the parallel sub-rod 912 has a racetrack-shaped cross-section.

The lifting structure 80 further includes a driving conical gear 83, a driven conical gear 84, a first driven rotatable shaft 85 and a second driven rotatable shaft 86. One end of the first driven rotatable shaft 85 is provided with a second transmission assembly 92, the second transmission assembly 92 is provided with a waist-shaped hole 920 extending in the direction vertical to the first driven rotatable shaft 85, the parallel sub-rod 912 of the first transmission assembly 91 penetrates through the waist-shaped hole 920 and is slidably connected to the waist-shaped hole 920, the other end of the first driven rotatable shaft 85 is secured to the driving conical gear 83. The driving conical gear 83 and the driven conical gear 84 are connected in a manner of drive with intersecting axes, two ends of the second driven rotatable shaft 86 are secured to the driven conical gear 84 and one end of one support arm 821 of the two support arms 821 in one of the at least two support arm groups respectively, and the other end of the one support arm supports one end of one of the at least two retractable rods 81.

The working principle of the lifting structure is described below.

First, each of the multiple controllers controls a respective driving motor 51 to drive a respective driving rotatable shaft 52 to rotate, and then the respective driving rotatable shaft 52 drives a respective one of the multiple inclined plates 221 connected to the driving rotatable shaft 52 to rotate. Meanwhile, the first and last driving rotatable shafts 52 are secured to the first transmission assembly 91, and the first transmission assembly 91 also synchronously rotates with the rotation of the first and last inclined plates 221 in the first direction 1. Based on the preceding transmission structure, the first transmission assembly 91 transmits the torque of the driving rotatable shafts 52 to the support arms 821 through the second transmission assembly 92, the driving conical gear 83 and the driven conical gear 84, and the support arms 821 lift the respective retractable rod 81 in the rotation process. It is to be understood that the first and last inclined plates 221 synchronously rotate, that is, the rotation angles are consistent, so the two support arms 821 of the one support arm group are synchronously lifted, and four support arms 821 of the two support arm groups may lift all the V-shaped opening mechanisms 220 through the two retractable rods 81 to compensate for the reduction in the vertical heights of the V-shaped opening mechanisms 220 when the angles of the V-shaped opening mechanisms 220 increase.

It is to be noted that as seen from FIGS. 14 and 15, in the preceding transmission process, when the display device is stretched, the included angle formed by two inclined plates 221 of one V-shaped opening mechanism 220 increases, the bottom of the V-shaped opening mechanism 220 needs to be lifted, and the first and last driving rotatable shafts 52 arise in the vertical direction. Moreover, the spacing between adjacent V-shaped opening mechanisms 220 gradually increases, and the first and last driving rotatable shafts 52 also move in the horizontal direction. Therefore, in FIG. 16, based on that the driving rotatable shaft 52 synchronously lifts in the vertical direction and moves in the horizontal direction and that the lifting structure 80 and the housings are secured to each other, the embodiment of the present disclosure designs that the driving rotatable shaft 52 and the lifting structure 80 transmit the torque of the driving rotatable shaft 52 through the first transmission assembly 91 and the second transmission assembly 92. The first transmission assembly 91 not only synchronously moves in the vertical and horizontal directions with the driving rotatable shaft 52, but also rotates with the driving rotatable shaft 52, and the parallel sub-rod 912 having a racetrack-shaped cross-section on the first transmission assembly 91 penetrates through the waist-shaped hole 920 on the second transmission assembly 92 so that the parallel sub-rod 912 can move freely in the vertical and horizontal directions in the waist-shaped hole 920 and so that the torque of the radial sub-rod 911 can be transmitted to the second transmission assembly 92. In this case, the second transmission assembly 92 only rotates but does not move in the vertical and horizontal directions so that the lifting structure 80 secured to the housings can be driven, thereby rotating the two support arms 821 to lift the at least two retractable rods 81.

It is to be understood that the lifting structure 80 in the embodiment is mainly responsible for the overall lifting of the multiple support structures 20 or the height compensation for the lifting structure 80 while each of the multiple support structures 20 is responsible for the height compensation for the local position of the display panel 10. The lifting structure 80 and the multiple support structures 20 do not conflict with each other, and on the contrary, the overall flatness of the surface of the display panel 10 can be implemented through the cooperation of the lifting structure 80 and the multiple support structures 20.

Figure 19:
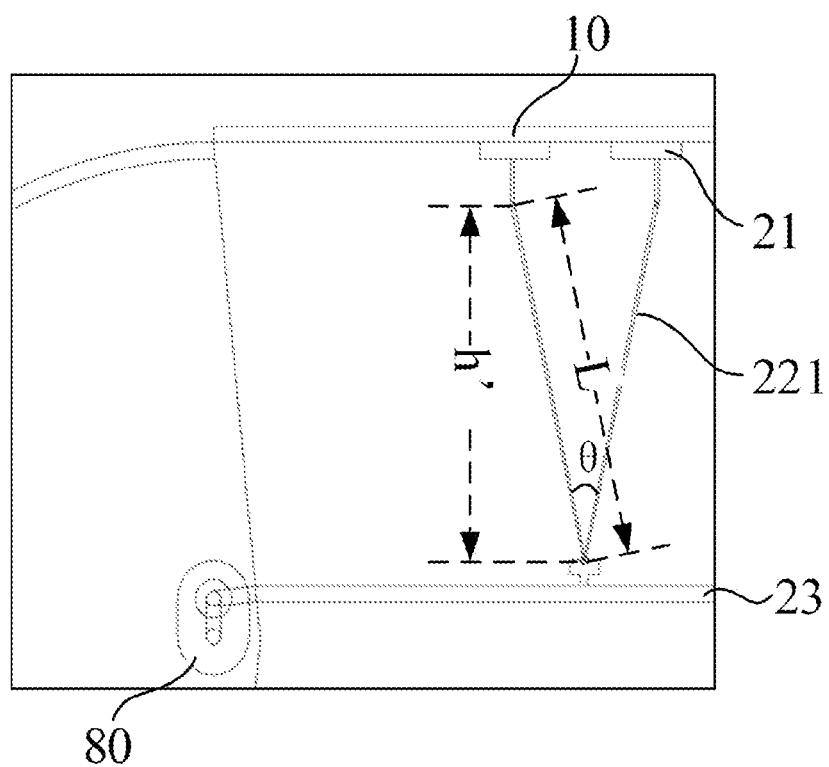
FIG. 19 is a view illustrating the lifting principle of a lifting structure according to embodiments of the present disclosure.

Further, the present disclosure also theoretically calculates the principle of the preceding lifting structure. FIG. 19 is a view illustrating the lifting principle of a lifting structure according to embodiments of the present disclosure. Referring to FIGS. 8 and 16 to 19, the lifting amount $\Delta h$ by which the lifting structure 80 lifts the multiple baseplates 23 in the accommodating cavity formed by the first housing and the second housing satisfies: $\Delta h = h - L*\cos \theta/2$; where h denotes the target support height of one of the multiple inclined plates 221, L denotes a rotation radius of the one inclined plate 221, and $\theta$ denotes the current included angle formed by two adjacent ones of the multiple inclined plates 221.

It can be seen that $\theta/2$ actually denotes the inclined angle of the inclined plate 221 relative to the vertical direction, and $L*\cos \theta/2$ denotes the current vertical height h' of the inclined plate 221. The target support height of the inclined plate 221 is the target vertical height of the inclined plate 221. It is to be understood that the lifting amount of the lifting structure 80, that is, the lifting amount of the bottoms of the multiple inclined plates 221 is equal to the difference between the target support height of the inclined plate 221 and the current vertical height of the inclined plate 221.

It is to be noted that based on the current inclined angle of the inclined plate 221 or the current included angle formed by the two inclined plates 221, the lifting amount $\Delta h$ is configured to further calculate the rotation angle of the inclined plate 221 to control the respective one of the multiple driving motors 51 to drive the inclined plate 221 to rotate by a corresponding angle. The preceding calculation process is executed by the controllers, and the target support height of the inclined plate 221 is also comprehensively obtained by the respective one of the multiple controllers according to the magnitude of the force fed back by the respective one of the multiple force detection structures 60 and the current retractable amount of the display device.

It is to be noted that the preceding are only alternative embodiments of the present disclosure and technical principles used therein. It is to be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A display device, comprising:
a display panel;
a plurality of support structures located on one side of the display panel facing away from a light-emitting side, wherein the plurality of support structures support different regions of the display panel and are configured to adjust vertical heights of the different regions of the display panel, respectively; and
a first housing and a second housing embedded to each other; wherein the plurality of support structures are sequentially arranged in a first direction and located in an accommodating cavity formed by the first housing and the second housing, the first housing and the second housing are relatively movable along the first direction, and the plurality of support structures are relatively retractable in the first direction, wherein the first direction is parallel to a plane on which the display panel is located;
wherein in a process of the first housing and the second housing moving along the first direction, a height of a display region located above the first housing and a height of a display region located above the second housing maintain consistent in a direction vertical to the plane on which the display panel is located.

2. The display device according to claim 1, wherein the plurality of support structures comprise a plurality of support plates, the plurality of support plates abut against the different regions on the side of the display panel facing away from the light-emitting side, and vertical projections of the plurality of support plates on the plane on which the display panel is located do not overlap.

3. The display device according to claim 2, wherein the plurality of support structures further comprise a plurality of height adjustment mechanisms, and each of the plurality of height adjustment mechanisms is mechanically connected to a respective one of the plurality of support plates to adjust a vertical height of the respective one of the plurality of support plates.

4. The display device according to claim 3, wherein the plurality of height adjustment mechanisms comprise a plurality of inclined plates, and the plurality of inclined plates are inclined relative to the display panel and sequentially arranged in the first direction;
a first side of each of the plurality of inclined plates is rotatably connected to the respective one of the plurality of support plates, second sides of the plurality of inclined plates are located on a same plane, and the first side of each of the plurality of inclined plates is opposite to a second side of the each of the plurality of inclined plates; and
each of the plurality of height adjustment mechanisms is configured to adjust the vertical height of the respective one of the plurality of support plates in response to an inclined degree of a respective one of the plurality of inclined plates.

5. The display device according to claim 4, wherein any two adjacent ones of the plurality of inclined plates are inclined relative to the display panel in directions opposite to each other;
wherein each two adjacent ones of the plurality of inclined plates form one opening mechanism, second sides of the each two adjacent ones of the plurality of inclined plates of the one opening mechanism are located on one central rotatable shaft and are rotatable towards or away from each other around the one central rotatable shaft.

6. The display device according to claim 4, further comprising a lifting structure, wherein the lifting structure is located in the accommodating cavity formed by the first housing and the second housing, and the plurality of support structures are located on the lifting structure; and
the lifting structure is configured to synchronously lift a height of bottom surfaces of the plurality of the support structures in the accommodating cavity in response to a relative retractable amount of the first housing and the second housing.

7. The display device according to claim 6, wherein the plurality of support structures further comprise a plurality of baseplates, each of the plurality of height adjustment mechanisms is disposed on a respective one of the plurality of baseplates, and the plurality of baseplates are located on a same plane and relatively movable in the first direction.

8. The display device according to claim 7, wherein
the lifting structure comprises at least two retractable rods and at least two support groups, wherein a number of the at least two retractable rods is the same as a number of the at least two support arm groups; and each of the at least two retractable rods penetrates through the plurality of baseplates of the plurality of support structures, each of the at least two support arm groups comprises two support arms, and two support arms of a same one of the at least two support arm groups synchronously support two ends of a respective one of the at least two retractable rods; and
the at least two support arm groups are configured to synchronously lift the at least two retractable rods in response to the relative retractable amount of the first housing and the second housing.

9. The display device according to claim 8, wherein any two adjacent ones of the plurality of inclined plates are inclined relative to the display panel in directions opposite to each other;
each two adjacent ones of the plurality of inclined plates form one opening mechanism, second sides of the each two adjacent ones of the plurality of inclined plates of the one opening mechanism are located on one central rotatable shaft and are rotatable towards or away from each other around the one central rotatable shaft;
in each of a first opening mechanism and a last opening mechanism in the first direction, second sides of inclined plates are secured to a driving rotatable shaft, and one end of the driving rotatable shaft facing away from the inclined plates of the one opening mechanism is securely provided with a first transmission assembly;
wherein the first transmission assembly comprises a radial sub-rod and a parallel sub-rod, two ends of the radial sub-rod are secured to the driving rotatable shaft and the parallel sub-rod respectively, the radial sub-rod is vertical to the driving rotatable shaft and the parallel sub-rod, and the parallel sub-rod is parallel to the driving rotatable shaft and has a racetrack-shaped cross-section; and the lifting structure further comprises a driving conical gear, a driven conical gear, a first driven rotatable shaft and a second driven rotatable shaft; wherein one end of the first driven rotatable shaft is provided with a second transmission assembly, the second transmission assembly is provided with a waist-shaped hole extending in a direction vertical to the first driven rotatable shaft, the parallel sub-rod of the first transmission assembly penetrates through the waist-shaped hole and is slidably connected to the waist-shaped hole, the other end of the first driven rotatable shaft is secured to the driving conical gear, the driving conical gear and the driven conical gear are connected in a manner of drive with intersecting axes, two ends of the second driven rotatable shaft are secured to the driven conical gear and one end of one support arm of the two support arms in one of the at least two support arm groups respectively, and the other end of the one support arm supports one end of a respective one of the at least two retractable rods.

10. The display device according to claim 9, wherein a lifting amount Δh by which the lifting structure lifts the plurality of baseplates in the accommodating cavity formed by the first housing and the second housing satisfies: $\Delta h = h - L*\cos \theta/2$;
wherein h denotes a target support height of one of the plurality of inclined plates, L denotes a rotation radius of the one of the plurality of inclined plates, and θ denotes a current included angle formed by two adjacent ones of the plurality of inclined plates.

11. The display device according to claim 3, wherein the plurality of height adjustment mechanisms comprise a plurality of lifting rods, an extension direction of each of the plurality of lifting rods is vertical to the plane on which the display panel is located, a first end of the each of the plurality of lifting rods is secured to a respective one of the plurality of support plates, and second ends of the plurality of lifting rods are located on a same plane; and
each of the plurality of height adjustment mechanisms is configured to adjust the vertical height of the respective one of the plurality of support plates in response to a retractable length of a respective one of the plurality of lifting rods.

12. The display device according to claim 4, further comprising a plurality of driving structures, wherein each of the plurality of driving structures is configured to drive a respective one of the plurality of height adjustment mechanisms to adjust a vertical height of a respective one of the plurality of the support plates in response to a magnitude of force applied to a respective one of the plurality of support structures that are supporting the display panel.

13. The display device according to claim 12, wherein
each of the plurality of driving structures comprises a driving motor and a driving rotatable shaft, the driving motor is connected to a second side of a respective one of the plurality of inclined plates through the driving rotatable shaft, and the driving motor is configured to drive the respective one of the plurality of inclined plates to rotate by a set angle in response to a magnitude of force applied to a respective one of the plurality of support structures that are supporting the display panel.

14. The display device according to claim 12, further comprising a plurality of force detection structures and a plurality of controllers, wherein each of the plurality of controllers is electrically connected to a respective one of the plurality of force detection structures and a respective one of the plurality of driving structures; and each of the plurality of force detection structures is configured to detect the magnitude of the force applied to the respective one of the plurality of support structures that are supporting the display panel, and each of the plurality of controllers is configured to control the respective one of the plurality of driving structures to drive the respective one of the plurality of height adjustment mechanisms to adjust the vertical height of the respective one of the plurality of support plates according to the magnitude of the force applied to the respective one of the plurality of support structures that are supporting the display panel.

15. The display device according to claim 14, wherein the plurality of force detection structures comprise a plurality of stress sensors;
wherein the plurality of stress sensors are disposed on one side of the plurality of support plates facing the display panel; or
wherein the plurality of support structures comprise a plurality of baseplates, each of the plurality of height adjustment mechanisms is disposed on a respective one of the plurality of baseplates, the plurality of baseplates are located on a same plane and relatively movable in the first direction, and each of the plurality of stress sensors is disposed between a second side of a respective one of the plurality of inclined plates and the respective one of the plurality of baseplates.

16. The display device according to claim 1, further comprising a plurality of resilient structures, wherein each of the plurality of resilient structures is disposed between two adjacent ones of the plurality of support structures, and two ends of the each of the plurality of resilient structures are secured to the two adjacent ones of the plurality of support structures respectively.

17. The display device according to claim 1, wherein guideway structures matchable with each other are disposed on the first housing and the second housing respectively, and the first housing and the second housing are slidably connected to each other through the guideway structures.

18. The display device according to claim 17, wherein an inner wall of the first housing is provided with a first panel slidable groove, an inner wall of the second housing is provided with a second panel slidable groove, a height of the first panel slidable groove is flush with a height of the second panel slidable groove in the direction vertical to the plane on which the display panel is located, and two sides of the display panel vertical to the first direction are accommodated in the first panel slidable groove and the second panel slidable groove.

19. The display device according to claim 1, wherein one end of the first housing facing away from the second housing is provided with a panel rolling cavity, a resilient reel is disposed in the panel rolling cavity, the display panel comprises a first side and a second side opposite to each other, the first side of the display panel is secured to the first housing, the second side of the display panel is secured to the resilient reel, and the display panel is configured to roll around the resilient reel.

\* \* \* \* \*